United States Patent
Vitikkate et al.

(10) Patent No.: US 9,001,458 B1
(45) Date of Patent: Apr. 7, 2015

(54) HARD DISK DRIVE SEALED IN HELIUM USING A SECONDARY CONTAINER

(71) Applicant: HGST Netherlands B.V., Amsterdam (NL)

(72) Inventors: Vipin Ayanoor Vitikkate, Palakkad-Kerala (IN); Toshiki Hirano, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/099,870

(22) Filed: Dec. 6, 2013

(51) Int. Cl.
*G11B 33/08* (2006.01)
*B23K 1/00* (2006.01)
*B23K 1/20* (2006.01)
*B23K 31/02* (2006.01)
*G11B 33/14* (2006.01)

(52) U.S. Cl.
CPC .............. *G11B 33/148* (2013.01); *B23K 1/001* (2013.01); *B23K 1/0016* (2013.01); *B23K 1/20* (2013.01); *B23K 31/02* (2013.01)

(58) Field of Classification Search
USPC ....................................................... 360/97.22
See application file for complete search history.

(56) References Cited

U.S. PATENT DOCUMENTS

| | | | |
|---|---|---|---|
| 4,367,503 A | 1/1983 | Treseder | |
| 5,454,157 A | 10/1995 | Ananth et al. | |
| 6,023,392 A | 2/2000 | Kim | |
| 6,226,143 B1 | 5/2001 | Stefanksy | |
| 7,062,387 B1 | 6/2006 | Burns et al. | |
| 7,123,440 B2 * | 10/2006 | Albrecht et al. | 360/99.18 |
| 7,315,447 B2 | 1/2008 | Inoue et al. | |
| 7,986,490 B2 | 7/2011 | Hirono et al. | |
| 8,014,167 B2 | 9/2011 | Gunderson et al. | |
| 8,196,284 B2 | 6/2012 | Uefune et al. | |
| 8,199,425 B1 | 6/2012 | Gustafson et al. | |
| 8,248,724 B2 * | 8/2012 | Hayakawa et al. | 360/97.22 |
| 8,279,552 B2 * | 10/2012 | Stipe | 360/99.18 |
| 8,427,787 B2 | 4/2013 | McGuire, Jr. | |
| 8,451,559 B1 | 5/2013 | Berding et al. | |
| 8,514,514 B1 * | 8/2013 | Berding et al. | 360/97.11 |
| 8,659,849 B2 * | 2/2014 | Hayakawa et al. | 360/97.22 |
| 2006/0050429 A1 | 3/2006 | Gunderson et al. | |
| 2009/0097375 A1 | 4/2009 | Uefune et al. | |
| 2012/0176701 A1 | 7/2012 | Schreck | |
| 2012/0275054 A1 | 11/2012 | McGuire, Jr. et al. | |
| 2013/0170074 A1 | 7/2013 | Hayakawa et al. | |

OTHER PUBLICATIONS

Kovar, Joseph F., "Western Digital's HGST: Helium-Filled Hard Drives", CRN News, Analysis, and Perspective for VARS and Technology Integrators, Sep. 13, 2012, pp. 1-3, URL: http://www.crn.com/news/storage/240007269/western-digitals-hgst-helium-filled-hard-drives.htm?pgno=2.

* cited by examiner

*Primary Examiner* — Mark Blouin
(74) *Attorney, Agent, or Firm* — John D. Henkhaus (57) ABSTRACT

A hard disk drive (HDD) assembly includes a conventional HDD enclosed within a two-piece metal container, whereby a lid is hermetically sealed to a body by melted metal and wherein the container is filled with helium gas. For example, the container may be formed of tin-plated steel and the two pieces soldered together to form the hermetically sealed container, having an electrical feed-through sealed similarly.

21 Claims, 6 Drawing Sheets

HARD DISK DRIVE SEALED IN HELIUM USING A SECONDARY CONTAINER

FIELD OF EMBODIMENTS OF THE INVENTION

Embodiments of the invention relate generally to hard disk drives and more particularly to sealing a hard disk drive in helium.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read/write head that is positioned over a specific location of a disk by an actuator.

A read/write head uses a magnetic field to read data from and write data to the surface of a magnetic-recording disk. Write heads make use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

There are various benefits to sealing and operating an HDD in helium ambient, because the density of helium is one-seventh that of air. For example, operating an HDD in helium reduces the drag force acting on the spinning disk stack and the mechanical power used by the disk spindle motor is substantially reduced. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDDs is also increased due to low humidity, less sensitivity to altitude and external pressure variations, and the absence of corrosive gases or contaminants. However, known methods of sealing an HDD in helium result in a marked increase in the cost of the HDD and, if there is any leak detected later, there is no alternative but to scrap the entire HDD. Thus, a new approach to sealing an HDD with helium inside is desirable.

SUMMARY OF EMBODIMENTS

Embodiments are directed towards a hard disk drive (HDD) assembly, in which a conventional HDD is enclosed within a two-piece metal container whereby a lid is hermetically sealed to a body by melted metal and wherein the container is filled with helium gas. For example, the container may be formed of tin-plated steel, or other metal with a solder wettable surface, and the two pieces soldered together to form the hermetically sealed container, having an electrical feedthrough sealed similarly. Alternatively, the container may be formed of aluminum, or other welding-compatible metal, and the two pieces welded together to form the hermetically sealed container.

According to an embodiment, a method of hermetically sealing an HDD in a secondary metal container includes soldering a seamless deep drawn metal lid with solder wettable surface, such as tin-plated steel, to a seamless deep drawn metal base with solder wettable surface, such as tin-plated steel, creating a semi-sealed assembly with an HDD inside. Then the assembly is placed into a vacuum chamber and a vacuum is applied to remove all the air from the internal HDD via the breather filter and from the container assembly via an inlet/outlet port, then the chamber is filled with a helium gas mixture at a predetermined pressure in order to fill the internal HDD and the container assembly with helium. After maintaining the predetermined pressure for a predetermined period of time, the port is sealed using one of several described approaches, thereby forming a true hermetically sealed, airtight assembly.

Embodiments discussed in the Summary of Embodiments section are not meant to suggest, describe, or teach all the embodiments discussed herein. Thus, embodiments of the invention may contain additional or different features than those discussed in this section.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION

Approaches to a hard disk drive (HDD) sealed in helium using a secondary container are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of Illustrative Embodiments

Figure 1:
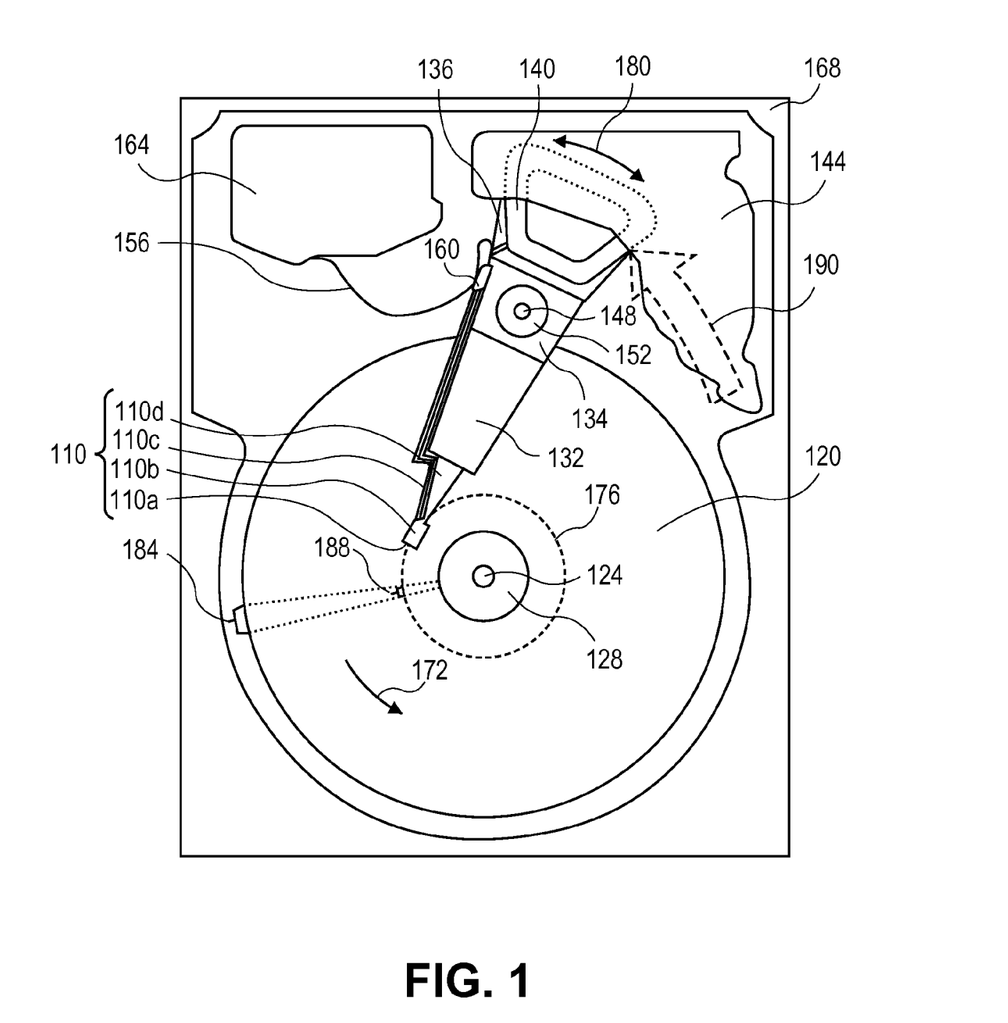
FIG. 1 is a plan view illustrating a hard disk drive (HDD), according to an embodiment of the invention.

Embodiments of the invention may be used in the context of a hard disk drive sealed in helium using a secondary container. In accordance with an embodiment, a plan view illustrating an HDD 100 is shown in FIG. 1. FIG. 1 illustrates the functional arrangement of components of the HDD including a slider 110*b* that includes a magnetic-reading/recording head 110*a*. Collectively, slider 110*b* and head 110*a* may be referred to as a head slider. The HDD 100 includes at least one head gimbal assembly (HGA) 110 including the head slider, a lead suspension 110*c* attached to the head slider, and a load beam 110*d* attached to the lead suspension 110*c*. The HDD 100 also includes at least one magnetic-recording media 120 rotatably mounted on a spindle 124 and a drive motor attached to the spindle 124 for rotating the media 120. The head 110*a* includes a write element and a read element for respectively writing and reading information stored on the media 120 of the HDD 100. The media 120 or a plurality of disks may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134; and a stator 144 including a voice-coil magnet. The armature 136 of the VCM is attached to the carriage 134 and is configured to move the arm 132 and the HGA 110 to access portions of the media 120 being mounted on a pivot-shaft 148 with an interposed pivot-bearing assembly 152. In the case of an HDD having multiple disks, or platters as disks are sometimes referred to in the art, the carriage 134 is called an "E-block," or comb, because the carriage is arranged to carry a ganged array of arms that gives it the appearance of a comb.

With further reference to FIG. 1, in accordance with an embodiment of the present invention, electrical signals, for example, current to the voice coil 140 of the VCM, write signal to and read signal from the head 110*a*, are provided by a flexible interconnect cable 156 ("flex cable"). Interconnection between the flex cable 156 and the head 110*a* may be provided by an arm-electronics (AE) module 160, which may have an on-board pre-amplifier for the read signal, as well as other read-channel and write-channel electronic components. The AE 160 may be attached to the carriage 134 as shown. The flex cable 156 is coupled to an electrical-connector block 164, which provides electrical communication through electrical feedthroughs provided by an HDD housing 168. The HDD housing 168, also referred to as a casting, depending upon whether the HDD housing is cast, in conjunction with an HDD cover provides a sealed, protective enclosure for the information storage components of the HDD 100.

With further reference to FIG. 1, in accordance with an embodiment of the present invention, other electronic components, including a disk controller and servo electronics including a digital-signal processor (DSP), provide electrical signals to the drive motor, the voice coil 140 of the VCM and the head 110*a* of the HGA 110. The electrical signal provided to the drive motor enables the drive motor to spin providing a torque to the spindle 124 which is in turn transmitted to the media 120 that is affixed to the spindle 124 by the disk clamp 128; as a result, the media 120 spins in a direction 172. The spinning media 120 creates a cushion of air that acts as an air-bearing on which the air-bearing surface (ABS) of the slider 110*b* rides so that the slider 110*b* flies above the surface of the media 120 without making contact with a thin magnetic-recording medium in which information is recorded.

The electrical signal provided to the voice coil 140 of the VCM enables the head 110*a* of the HGA 110 to access a track 176 on which information is recorded. Thus, the armature 136 of the VCM swings through an arc 180 which enables the HGA 110 attached to the armature 136 by the arm 132 to access various tracks on the media 120. Information is stored on the media 120 in a plurality of stacked tracks arranged in sectors on the media 120, for example, sector 184. Correspondingly, each track is composed of a plurality of sectored track portions, for example, sectored track portion 188. Each sectored track portion 188 is composed of recorded data and a header containing a servo-burst-signal pattern, for example, an ABCD-servo-burst-signal pattern, information that identifies the track 176, and error correction code information. In accessing the track 176, the read element of the head 110*a* of the HGA 110 reads the servo-burst-signal pattern which provides a position-error-signal (PES) to the servo electronics, which controls the electrical signal provided to the voice coil 140 of the VCM, enabling the head 110*a* to follow the track 176. Upon finding the track 176 and identifying a particular sectored track portion 188, the head 110*a* either reads data from the track 176 or writes data to the track 176 depending on instructions received by the disk controller from an external agent, for example, a microprocessor of a computer system.

Introduction

As mentioned, due to the low density of helium as compared to air, there are many advantages of hermetically sealing and operating hard disk drives in helium ambient. With current hermetically sealed helium HDDs, in order to prevent leakage of the helium through the aluminum base, vacuum die cast aluminum may be used, along with other modifications such as nickel plating on the aluminum base in order to solder the feed through and low viscosity and low helium permeability epoxy to seal narrow holes. Further, a secondary cover may be laser welded onto the drive, which adds to the over all cost of the drives.

One of the penalties associated with hermetically sealing an HDD in helium inside a base conventionally made of cast aluminum is an increase in the cost. Therefore, an approach to sealing an HDD in helium so as to minimize the cost and increase the reliability of the HDD by reducing the potential for helium leakage, is desirable. By sealing the HDD in helium in a secondary container, as described in embodiments herein, the associated cost due to vacuum die-casting and nickel-plating the base can be avoided.

Hermetically Sealed Hard Disk Drive Assembly

Figure 2:
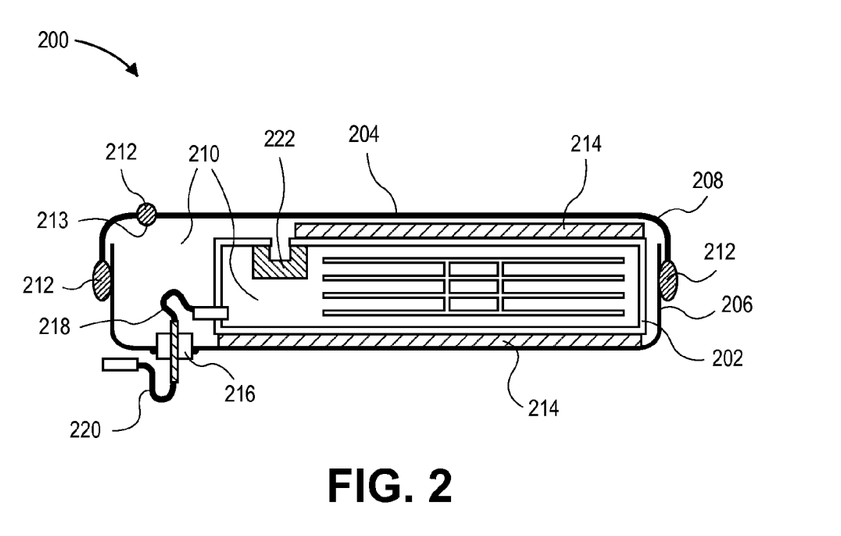
FIG. 2 is cutaway view illustrating a hermetically sealed HDD assembly, according to an embodiment of the invention.

FIG. 2 is cutaway view illustrating a hermetically sealed hard disk drive (HDD) assembly, according to an embodiment of the invention. HDD assembly 200 comprises a two-piece metal container 204 in which an HDD 202 is enclosed. The container 204 comprises a lid 208 hermetically sealed by melted metal 212 to a container body 206, where the HDD 202 and the container 204 are filled with helium 210 (or a substantially helium gas mixture). Preferably, the HDD 202 is made similarly to the conventional non-helium sealed HDDs and then sealed in a secondary container as described herein.

According to one embodiment, the metal container 204 is formed of solder-wettable material and the lid 208 is hermetically sealed by solder to the body 206. For example, the body 206 and lid 208 of the metal container 204 may be formed of tin-plated steel, sealed together with solder. According to another embodiment, the metal container 204 is formed of welding-compatible material and the lid 208 is hermetically sealed by welding to the body 206. For example, the body 206 and lid 208 of the metal container 204 may be formed of aluminum or a steel alloy such as stainless steel, sealed together by laser welding, resistive welding, arc welding, gas torch, and the like.

According to an embodiment, HDD assembly 200 comprises a thermally conductive material 214 positioned between the HDD 202 and one or more internal surface of the metal container 204, where the thermally conductive material 214 is suitably chosen and configured to conduct heat from the HDD 202 to the metal container 204. A material having a thermal conductivity greater than that of helium is suitable for this heat transfer purpose. For non-limiting examples, a rubber such as neoprene, nitrile rubber, and polyurethane rubber are suitable for this use, as are metals such as copper or aluminum.

According to an embodiment, HDD assembly 200 comprises an electrical feed-through 216 hermetically sealed by melted metal to the container body 206. Thus, HDD assembly 200 can be configured with an electrical transmission means 218 between the HDD 202 and the electrical feed-through 216, and with an electrical transmission means 220 between the electrical feed-through 216 and a host connector, for carrying signals and power therebetween. Each of the electrical transmission means 218 and 220 may comprise, for example, a flexible cable assembly, a printed circuit board, and the like. Additionally and according to an embodiment, HDD assembly 200 includes an inlet/outlet port 213, which is configured to allow the passing of gases therethrough, such as with the exchange of air for helium, as is described in more detail in reference to FIGS. 3A-3C and FIG. 6.

Preferably, the same sealing method and material is used for all the sealed areas of metal container 204, thereby minimizing manufacturing costs. For example, in the case of a tin-plated steel container 204, melted solder is used as the metal 212 to non-permeably seal each of the lid 208 and the electrical feed-through 216 to the body 206, as well as to hermetically seal the port 213 once the helium injection process is completed. For another example, in the case of an aluminum container 204, each of the lid 208 and the electrical feed-through 216 are sealed to the body 206 by welding the respective components together, and a slightly different process may be used to hermetically seal the port 213, as described in more detail in reference to FIGS. 5A-5B and FIG. 6. With implementation of the embodiments described herein, the hermetic seal is maintained by the secondary container 204, which can be sealed using relatively cheaper and reliable methods of sealing.

Once all the sealed areas are sealed, a true hermetically sealed HDD assembly 200 is provided. As such, the metal container 204 of HDD 200 is sealed at a known and constant internal pressure and, therefore, is truly a hermetically sealed, airtight assembly. This is in contrast with HDDs fabricated and "sealed" with helium inside, but that maintain a pressure relief valve or a breather unit or any other mechanism for the exchange of gases into and out of, the leakage of gases out of, and/or provide for pressure variations inside of, the HDD assembly.

Sealing a Hard Disk Drive in Helium in a Secondary Container

Figure 3A:
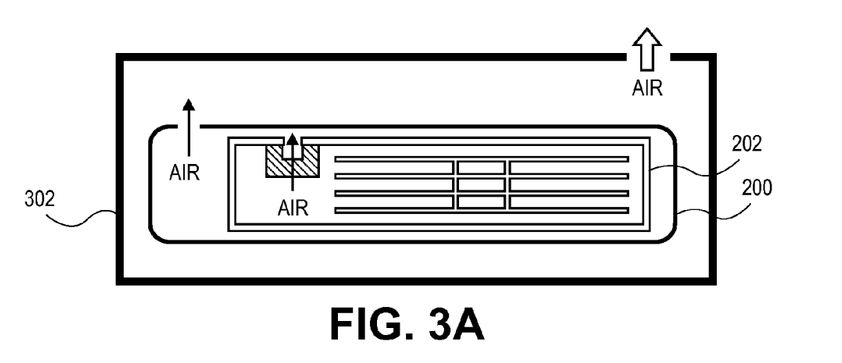
FIG. 3A is cutaway view illustrating a process for purging an HDD assembly, according to an embodiment of the invention.
Figure 3B:
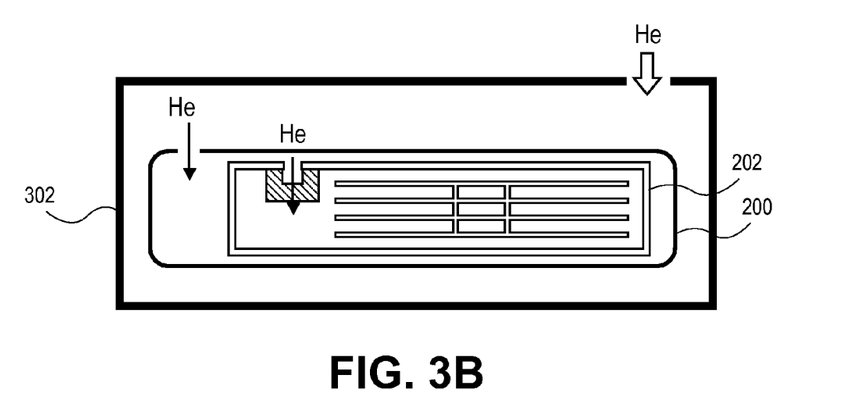
FIG. 3B is cutaway view illustrating a process for filling an HDD assembly with helium, according to an embodiment of the invention.
Figure 3C:
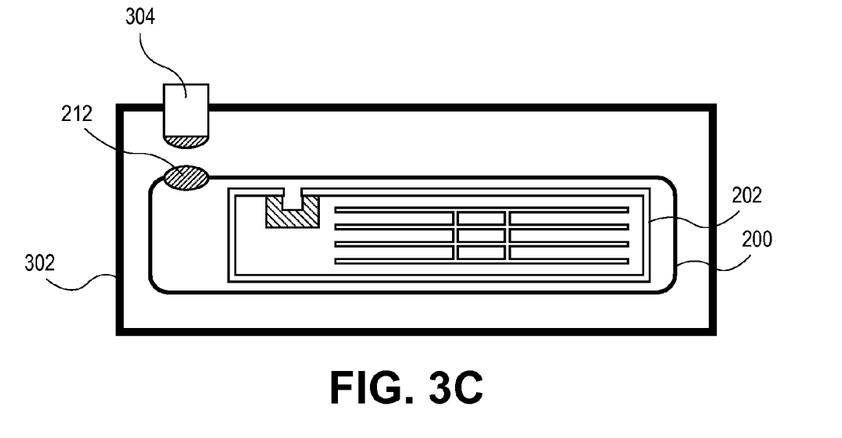
FIG. 3C is cutaway view illustrating a process for sealing a helium-filled HDD assembly, according to an embodiment of the invention.
Figure 6:
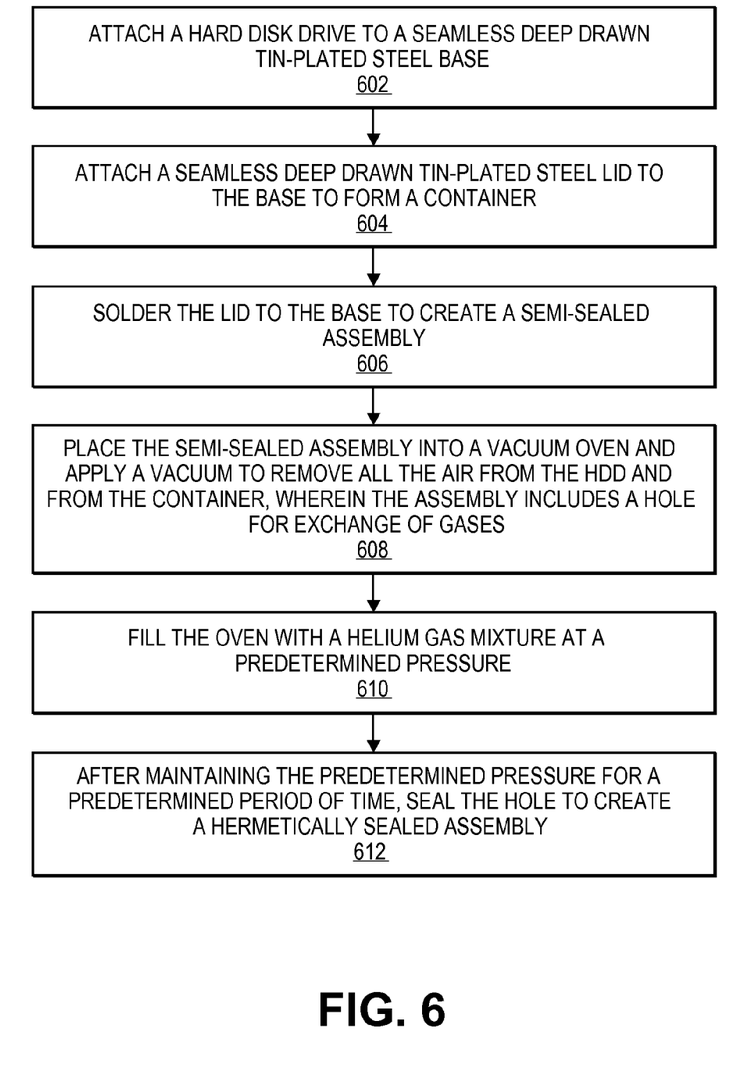
FIG. 6 is a flow diagram illustrating a method for hermetically sealing an HDD in a secondary metal container, according to an embodiment of the invention.

FIG. 6 is a flow diagram illustrating a method for hermetically sealing an HDD in a secondary metal container, according to an embodiment of the invention. The method of FIG. 6 is described with reference additionally to FIGS. 3A, 3B, 3C, where FIG. 3A is cutaway view illustrating a process for purging an HDD assembly, FIG. 3B is cutaway view illustrating a process for filling an HDD assembly with helium, and FIG. 3C is cutaway view illustrating a process for sealing a helium-filled HDD assembly, all according to an embodiment of the invention. Note, however, that the process described in reference to FIGS. 3A-3C may be implemented and practiced without all the specific details illustrated in reference to the method embodiment of FIG. 6.

With reference first to FIG. 6, at block 602 a hard disk drive is attached to a seamless deep drawn metal base having a solder wettable surface. For example and in reference to FIG. 2, an HDD 202 is attached to body 206 of container 204 of an HDD assembly 200, where the body 206 and lid 208 are formed of tin-plated steel, such as seamless deep-drawn tin-plated steel.

At block 604, a seamless deep drawn metal lid having solder wettable surface is attached to the base to form a container. For example and in reference to FIG. 2, a lid 208 is attached to body 206 of container 204 of an HDD assembly 200, where the body 206 and lid 208 are formed of tin-plated steel, such as seamless deep-drawn tin-plated steel.

At block 606, the lid is soldered to the base to create a semi-sealed assembly. For example and in reference to FIG. 2, the lid 208 is soldered to the body 206 of container 204. At this stage, the container is only semi-sealed because a hole or port 213 (FIG. 2) is introduced, at some point preferably prior to block 608, for exchange of gasses.

At block 608, the semi-sealed assembly is placed into a vacuum chamber, as is depicted in FIG. 3A with HDD assembly 200 contained in a vacuum chamber 302. Further, a vacuum is applied to the inside of the vacuum chamber 302, whereby all the air is removed from the HDD 202 via a breather filter 222 (FIG. 2) or port, for example, and from the container 204 (FIG. 2) via the port 213 (FIG. 2).

At block 610, the chamber is filled with a helium gas mixture at a predetermined pressure, as is depicted in FIG. 3B with HDD assembly 200 contained in the vacuum chamber 302 and whereby the HDD 202 is filled with helium 210 (FIG. 2) via the breather filter 222 (FIG. 2), for example, and the container 204 (FIG. 2) is filled with helium via the port 213 (FIG. 2).

At block 612, after maintaining the predetermined pressure for a predetermined period of time, the hole is sealed to create a hermetically sealed assembly, as is depicted in FIG. 3C with the port 213 (FIG. 2) of HDD assembly 200 being sealed with melted metal 212, according to an embodiment. According to an embodiment, sealing the port 213 involves applying a molten or melted solder drop(s) to the port 213, while HDD assembly 200 is in the chamber. For example, this sealing process may be used in the context of a tin-plated steel or other solder wettable surfaced metal container 204 (FIG. 2) of HDD assembly 200.

Figure 4A:
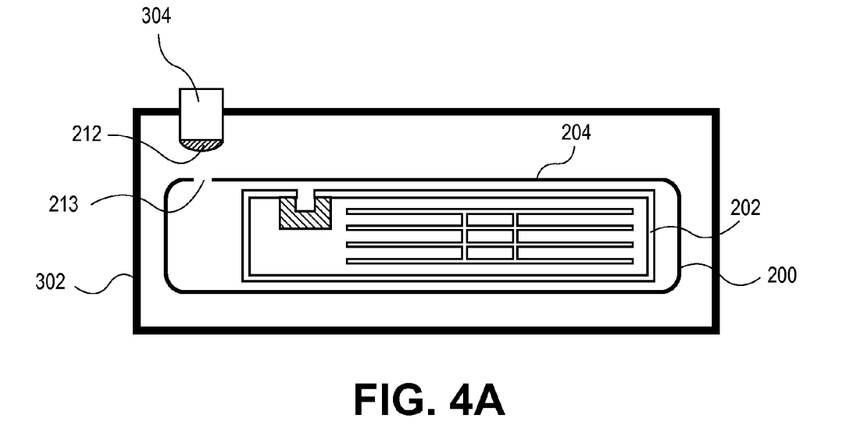
FIG. 4A is cutaway view illustrating a process for sealing a helium-filled HDD assembly, according to an embodiment of the invention.
Figure 4B:
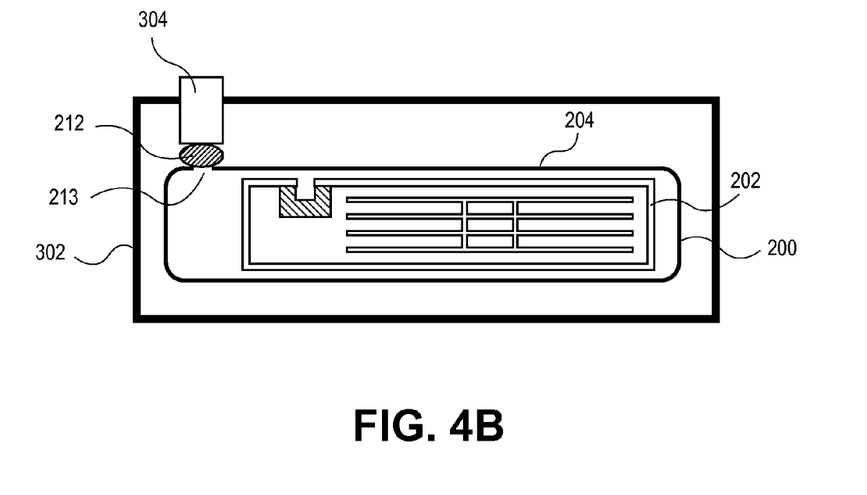
FIG. 4B is cutaway view illustrating a process for sealing a helium-filled HDD assembly, according to an embodiment of the invention.
Figure 5A:
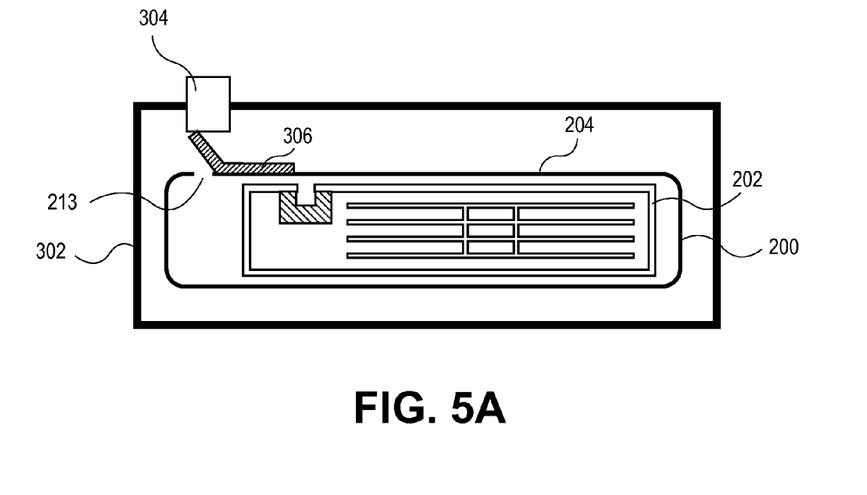
FIG. 5A is cutaway view illustrating a process for sealing a helium-filled HDD assembly, according to an embodiment of the invention.
Figure 5B:
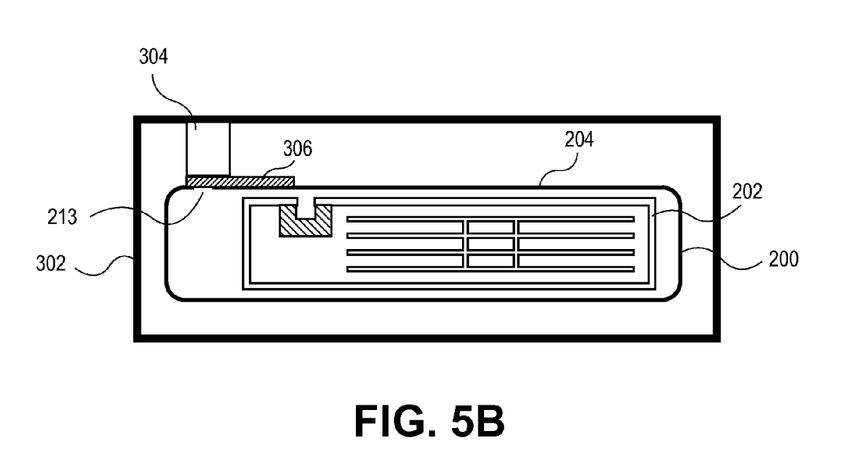
FIG. 5B is cutaway view illustrating a process for sealing a helium-filled HDD assembly, according to an embodiment of the invention.

To further describe embodiments corresponding to the sealing of port 213 (FIG. 2) according to block 612 of FIG. 6, FIG. 4A and FIG. 4B are cutaway views illustrating a process for sealing a helium-filled HDD assembly according to an embodiment of the invention, and FIG. 5A and FIG. 5B are cutaway views illustrating a process for sealing a helium-filled HDD assembly according to another embodiment of the invention.

With reference to FIGS. 4A and 4B and according to an embodiment, a metal adhesive tape is used to temporarily or "semi-seal" the port 213 while HDD assembly 200 is inside the vacuum chamber 302. For example, a plunger 304 may be used to semi-seal the port 213 with the metal tape. The plunger 304 holds the tape, depicted as metal 212, which is then pushed down to seal the port 213. After the temporarily sealed container 204 with the HDD 202 inside is removed from the vacuum chamber 302, the container 204 is then sealed permanently by soldering around the port 213, e.g., soldering around the edges of the metal tape 212. This sealing process may be used in the context of a tin-plated steel or other solder wettable surfaced metal container 204 of HDD assembly 200. Similarly, in the case of an aluminum or other welding-compatible container 204, the container 204 can be sealed permanently by welding around the port 213, such as around the edges of the metal tape.

Alternatively, with reference to FIGS. 5A and 5B and according to an embodiment, metal adhesive tape is used to temporarily or "semi-seal" the port 213 while HDD assembly 200 is inside the vacuum chamber 302. The metal tape 306 can be attached to the lid 208 (FIG. 2) of container 204 (FIG. 2) at an angle (e.g., prior to placing the assembly into the chamber 302), loosely covering the port 213 such as depicted in FIG. 5A, thereby keeping the port 213 open during the helium injection process (e.g., block 610 of FIG. 6). Then, the port 213 and therefore the container 204 are sealed by pushing the plunger 304 down over the port 213 to seal the port 213 with the metal tape 306. After the temporarily sealed container 204 with the HDD 202 inside is removed from the vacuum chamber 302, the container 204 is then sealed permanently by soldering around the port 213, e.g., soldering around the edges of the copper adhesive tape 212. This sealing process may be used in the context of a tin-plated steel or other solder wettable surfaced metal container 204 (FIG. 2) of HDD assembly 200. Similarly, in the case of an aluminum or other welding-compatible container 204, the container 204 can be sealed permanently by welding around the port 213, such as around the edges of the metal tape.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A hard disk drive (HDD) assembly, comprising:
    an HDD comprising:
        a head slider comprising a magnetic read/write head for reading data from and writing data to one or more magnetic-recording disk,
        a magnetic-recording disk rotatably mounted on a spindle,
        a voice coil actuator configured to move the head slider to access portions of the magnetic-recording disk, and
        an HDD enclosure in which said head slider, disk, spindle and voice coil actuator are enclosed;
    a metal container within which said HDD is enclosed, said container comprising:
        a body,
        a lid hermetically sealed to said body by melted metal, and
        wherein said container is filled with helium; and
    a thermally conductive material having a thermal conductivity greater than that of helium positioned between said HDD and the internal surface of said metal container, to conduct heat from said HDD to said metal container.

2. The HDD assembly of claim 1,
    wherein said metal container is formed of solder-wettable material, and
    wherein said lid is hermetically sealed to said body by solder.

3. The HDD assembly of claim 1,
    wherein said metal container is formed of tin-plated steel.

4. The HDD assembly of claim 1,
    wherein said metal container is hermetically sealed at a known and constant internal pressure.

5. The HDD assembly of claim 1,
    wherein said metal container is formed of welding-compatible material, and
    wherein said lid is hermetically sealed to said body by welding.

6. The HDD assembly of claim 5,
    wherein said metal container is formed of aluminum.

7. The HDD assembly of claim 5,
    wherein said metal container is formed of steel alloy.

8. The HDD assembly of claim 1, wherein said metal container further comprises:
    an electrical feed-through hermetically sealed to said body by melted metal.

9. The HDD assembly of claim 8, further comprising:
    electrical transmission means connected to said HDD and to said electrical feed-through for carrying signals therebetween.

10. A method of hermetically sealing a hard disk drive (HDD) in a secondary metal container, the method comprising:
    attaching an HDD to a seamless deep drawn metal base, of said secondary container, having a solder wettable surface;
    attaching a seamless deep drawn metal lid having a solder wettable surface to said base to form a container;
    soldering said lid to said base creating a semi-sealed assembly;
    placing said semi-sealed assembly into a vacuum chamber and applying a vacuum to remove all the air from said HDD and from said container, wherein said assembly comprises a port for exchange of gases;
    filling said chamber with a helium gas mixture at a predetermined pressure; and
    after maintaining said predetermined pressure for a predetermined period of time, sealing said port creating a hermetically sealed assembly.

11. The method of claim 10, wherein said metal base and said metal lid are formed of tin-plated steel.

12. The method of claim 10, wherein sealing said port comprises applying molten solder to said port.

13. The method of claim 10, wherein sealing said port comprises:
    applying metal adhesive tape to said port to temporarily seal said semi-sealed assembly; and
    after removing said semi-sealed assembly from said chamber, soldering around said port.

14. The method of claim 13, wherein applying said tape comprises pushing a plunger to which said tape is held into contact with said port.

15. The method of claim 10, further comprising:
attaching metal adhesive tape to said lid to loosely cover said port; and
wherein sealing said port comprises:
pushing a plunger into contact with said tape to cover said port with said tape to temporarily seal said semi-sealed assembly, and
after removing said semi-sealed assembly from said chamber, soldering around said port.

16. A method of hermetically sealing a hard disk drive (HDD) in a secondary metal container, the method comprising:
attaching an HDD to a welding-compatible metal base of said secondary container;
attaching a welding-compatible metal lid to said base to form a container;
welding said lid to said base creating a semi-sealed assembly;
placing said semi-sealed assembly into a vacuum chamber and applying a vacuum to remove all the air from said HDD and from said container, wherein said assembly comprises a port for exchange of gases;
filling said chamber with a helium gas mixture at a predetermined pressure; and
after maintaining said predetermined pressure for a predetermined period of time, sealing said port creating a hermetically sealed assembly.

17. The method of claim 16, wherein said welding-compatible metal base and welding-compatible metal lid are formed of aluminum.

18. The method of claim 16, wherein said welding-compatible metal base and welding-compatible metal lid are formed of steel alloy.

19. The method of claim 16, wherein sealing said port comprises:
applying metal adhesive tape to said port to temporarily seal said semi-sealed assembly; and
after removing said semi-sealed assembly from said chamber, welding around said port.

20. The method of claim 19, wherein applying said tape comprises pushing a plunger to which said tape is held into contact with said port.

21. The method of claim 16, further comprising:
attaching metal adhesive tape to said lid to loosely cover said port; and
wherein sealing said port comprises:
pushing a plunger into contact with said tape to cover said port with said tape to temporarily seal said semi-sealed assembly, and
after removing said semi-sealed assembly from said chamber, welding around said port.

* * * * *